United States Patent [19]
Bracchitta et al.

[11] Patent Number: 6,060,358
[45] Date of Patent: *May 9, 2000

[54] DAMASCENE NVRAM CELL AND METHOD OF MANUFACTURE

[75] Inventors: John A. Bracchitta, South Burlington; Jeffrey B. Johnson; Glen L. Miles, both of Essex Junction, all of Vt.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/955,209

[22] Filed: Oct. 21, 1997

[51] Int. Cl.$^7$ .................................................. H01L 21/336
[52] U.S. Cl. ............................................ 438/259; 438/296
[58] Field of Search .................................... 257/314, 315, 257/316, 317; 438/594, 270, 211, 221, 248, 264, 259, 296, 257, 263; 252/66

[56] References Cited

U.S. PATENT DOCUMENTS

| | | | |
|---|---|---|---|
| 4,905,062 | 2/1990 | Esquivel et al. | 257/316 |
| 5,045,490 | 9/1991 | Esquivel et al. | 438/259 |
| 5,051,795 | 9/1991 | Gill et al. | 257/317 |
| 5,173,436 | 12/1992 | Gill et al. | 438/262 |
| 5,238,855 | 8/1993 | Gill | 438/261 |
| 5,278,438 | 1/1994 | Kim et al. | 257/316 |
| 5,282,160 | 1/1994 | Yamagata | 257/314 |
| 5,290,723 | 3/1994 | Tani et al. | 438/594 |
| 5,432,110 | 7/1995 | Inoue | 257/316 |
| 5,559,048 | 9/1996 | Inoue | 438/257 |
| 5,753,554 | 5/1998 | Park | 438/296 |
| 5,763,310 | 6/1998 | Gardner | 438/270 |
| 5,773,343 | 6/1998 | Lee et al. | 438/259 |
| 5,793,082 | 8/1998 | Bryant | 257/330 |
| 5,882,971 | 3/1999 | Wen | 438/276 |
| 5,883,399 | 3/1999 | Yin et al. | 257/66 |

FOREIGN PATENT DOCUMENTS

2-087677  3/1990  Japan .

*Primary Examiner*—Olik Chaudhuri
*Assistant Examiner*—William David Coleman
*Attorney, Agent, or Firm*—Whitham, Curtis & Whitham; Eugene I. Shkurko, Esq.

[57] ABSTRACT

Recessing the floating gate of a NVRAM cell within a substrate or semiconductor layer between isolation structures permits manufacture by a simplified self-aligned process of high yield and economy while supporting maximum integration density and reducing or eliminating severe topography of the control gate connections which are formed in strips having a generally planar lower surface and which are of improved robustness and potentially fine pitch. Impurity implants are facilitated by thicknesses of various material present during portions of the process and in various combinations which may be advantageously exploited to obtain tailoring of impurity concentrations and profiles of both NVRAM cells and damascene field effect transistors formed by similar and compatible processes.

17 Claims, 6 Drawing Sheets

DAMASCENE NVRAM CELL AND METHOD OF MANUFACTURE

BACKGROUND OF THE INVENTION

1. Field of the Invention

The present invention generally relates to semiconductor integrated circuit memories field effect transistors and, more particularly, to non-volatile random access memory (NVRAM) structures and their manufacture.

2. Description of the Prior Art

Semiconductor memory structures are well-known and designs thereof have been integrated at high densities, providing, at the present state of the art, several million dynamic memory cells or tens of thousands of static memory cells on a single chip along with decoding, addressing, sensing and driving circuits allowing data stored therein to be changed at will. Such memories and the speed of access they allow are indispensable to support the high speed of digital processors presently available. However, the maintenance of storage states of the cells requires at least constant application of at least stand-by power and, for dynamic memory cells, periodic refreshing. Since storage states are not otherwise maintained, such memories are referred to as being volatile.

So-called read only memories (ROMs) are not volatile but the contents thereof cannot be changed. ROMs are, nevertheless, useful for personalization of electronic devices and storage of basic operational programming of processors since they generally support very high speed access. Otherwise, other storage media such as magnetic disks, bubble memories and the like have generally been used for non-volatile storage of data when the capability of changing the data must be provided even if access to the data is generally much slower.

To partially overcome the slower access time of other storage devices and media, various caching schemes have been developed which are, in general, quite effective to support the function of available high speed processors. Nevertheless, delays may be encountered when data required by the processor is not present in the cache, reducing predictability of task completion time. Further, use of a cache does not provide freedom from other characteristics of the storage medium utilized such as the mechanical vulnerability of magnetic disk drives to wear, impact, vibration and the like. Expansion of cache capacity to avoid significant delays due to the number of cache misses which may be encountered requires a degree of processing overhead as well as the time to access the desired amount of information from main storage, particularly as compared with processor cycle time.

Non-volatile semiconductor structures are known and have been referred to as programmable read only memories (PROMs) in view of the fact that data can be written or programmed therein rather than being established during the fabrication of the device. More recently, designs of PROMs have allowed data to be changed by erasure and rewriting. These structures generally employ electron tunnelling phenomena through a thin dielectric layer. Each tunnelling operation, however, causes a finite amount of damage to the dielectric and the number of write and erase cycles which can be performed before failure has been limited. Accordingly, these devices have been referred to as electrically erasable programmable read only memories (EEPROMs or flash EEPROMs if all cells of a partition are simultaneously erased) since they are intended for applications in which data will be changed only rarely.

More specifically, memory cells of EEPROMs generally include a structure similar to that of a field effect transistor but having an insulated floating gate electrode to which a control gate is capacitively coupled. Thus, a low voltage on the control gate together with presence or absence of charge stored on the floating gate can allow the reading of the cell in accordance with the resultant conductance of the transistor while higher voltages on the control gate cause hot electron injection or tunnelling of electrons from the conduction channel to or from the floating gate for writing or erasure of the EEPROM cell.

Very recently, some electron tunnelling mechanisms (e.g. Fowler-Nordheim tunnelling) have been exploited in which the damage to the dielectric during write and/or erase operations is very much reduced. Together with improvements in dielectric quality and distribution of write and erase operations over the memory array, the number of write and erase operations which can be accomplished before device failure has become sufficient to the expected service lifetime of computers and other electronic apparatus in which such memories may be employed. Thus, such devices can be used much in the manner of random access memories and have come to be referred to as non-volatile random access memories (NVRAMs). The number of storage cells which may be provided on a single chip has also become comparable to that of static RAMs and approaches that of dynamic RAMs. The non-volatile random access memories (NVRAMs) nomenclature thus also connotes the potential further applications now possible with the practical removal of limitations on the number of write/erase cycles which can be performed without significant degradation of the tunnelling oxide.

It should be understood, however, that the basic structure of the NVRAM cell has remained effectively unchanged from the structure of an EEPROM cell although a different tunnelling mechanism may be exploited and the operating parameters correspondingly altered. The structure of a NVRAM cell is relatively complex and critical and development of high manufacturing yields consistent with high integration density has proven difficult. Moreover, the additional applications for which modern NVRAMs are currently suitable has increased the need for reduction of NVRAM cell size and increased integration density.

Tunnelling effects on which NVRAMs continue to rely for write and erase operations, however, requires a higher voltage than is required for read operations while high integration density requires small sizes of the memory cells. To avoid breakdown, latch-up and other known types of malfunctions, isolation structures are generally required between NVRAM cells and write and erase voltages are kept as low as possible consistent with correct operation. By the same token, narrow operating margins for write and erase voltages together with isolation structures such as shallow trench isolation (STI) and recessed oxide isolation (ROX), both of which employ an insulator within the substrate and may also extend above the substrate surface, have required formation of the floating gate and the control gate along the sidewalls of the isolation structure in order to develop an adequate so-called coupling ratio of the capacitances of the control and floating gates. In general, the floating gate is made to overlap a portion of the ROX or STI, covered with a blanket layer of interpoly oxide and a doped polysilicon gate layer applied thereover and patterned.

Since the control gate must extend over the floating gate where the floating gate, in turn, extends over an isolation structure, severe large step topography is unavoidable in the control gate and the interpoly oxide, as well. This step is sufficiently steep to allow formation of a sidewall during subsequent routine processing (if not prevented by additional process steps) or breaks in the silicide of which the control gate or a connection thereto may be partially comprised (e.g. overlaying a doped polysilicon layer with a refractory metal silicide having low sheet resistance to form a so-called polycide connector). Breaks in the control gate silicide severely compromise manufacturing yield since a control gate generally overlies and provides access to a plurality of NVRAM cells and a break thus isolates and prevents access to cells beyond the break in the control gate.

Nevertheless, it should be understood that the severe topography described above has generally been exploited to advantage in developing an adequate coupling ratio of capacitance of the control gate to that of the floating gate. A minimum coupling ratio must be maintained so that the capacitive voltage divider can adequately raise or lower the potential of the floating gate for tunnelling to occur to write and erase the NVRAM cell. There is thus a trade-off between the coupling ratio and the voltage which must be applied for reliable writing and erasure and, consequently, the size and spacing of other structures to avoid breakdown, latch-up and the like and, ultimately, between manufacturing yield and the integration density which can be achieved. Accordingly, some degree of compromise of manufacturing yield, integration density and design optimization has been tolerated in previous designs which has increased the cost and limited production and application of high density NVRAMs both at the package level and in various computers and other electronic apparatus.

So-called damascene processes for semiconductor manufacture are now familiar to those skilled in the art, particularly for the reliable formation of highly robust conductors at fine pitch. Essentially, a generalized damascene process comprises forming a groove or recess of desired dimensions or pattern in a substrate or semiconductor layer, filling the groove or recess by the deposition of a blanket layer of material and planarizing the blanket layer back to the original surface of the substrate or semiconductor layer. The planarization thus serves to separate the layer into a plurality of formations, such as conductors, in accordance with the original shape of the groove(s) or recess(es). During and after the planarization, the material in the grooves or recesses is supported on all sides, resulting in a highly robust structure even when comprised of very soft metals or other materials. Since the grooves or recesses are ideally formed lithographically beginning with a highly planar surface, high lithographic resolution and fine pitch are thus supported. Further, the planarization after blanket layer deposition and filling of the grooves or recesses provides a highly planar surface on which further lithographic processes may be carried out with high accuracy and resolution.

However, at the present state of the art, due to difficulties with trench filling, throughput of planarization processes and the like, damascene processes are generally limited to the formation of conductors in which the advantages of robustness and fine pitch are pronounced and not otherwise obtainable. Damascene processes are not widely used for device (e.g. transistors and capacitors) construction within a substrate or layer or with materials which do not reliably fill high aspect ratio grooves or recesses. For high manufacturing yields, surface formation processes such as deposition and etching or patterned implantation are generally preferred for high manufacturing yields in the formation of specific devices integrated on a chip.

SUMMARY OF THE INVENTION

It is therefore an object of the present invention to provide a new geometry for NVRAM cells allowing increased manufacturing yield at increased integration density while allowing maintenance or increase of operating margins at low write and erase voltages.

It is another object of the invention to provide an NVRAM cell structure which can be formed with fewer, less critical and more economical process steps while increasing manufacturing yield.

It is a further object of the invention to avoid severe interpoly insulator and control gate topography in NVRAM cells which may be integrated at high density in a manner compatible with the inclusion of other devices on the same chip without significant increase of process complexity.

It is yet another object of the invention to provide a process of manufacture which provides substantial flexibility in dopant implantation processes for both memory cells and transistors made by compatible processes, particularly allowing independence of source/drain doping and channel doping.

In order to accomplish these and other objects of the invention, a semiconductor device is provided comprising a substrate or layer having an isolation structure protruding therefrom, a gate insulator and electrode recessed within a trench in the substrate or layer with the electrode protruding above the substrate surface, and an implanted region located in accordance with an implantation energy and self-aligned with the trench.

In accordance with another aspect of the invention, a method of making a semiconductor device is provided including the steps of forming a trench in a semiconductor layer or substrate through an aperture in a layer of material, forming an insulator layer on surfaces of the semiconductor layer or substrate within the trench, filling the trench and the aperture with semiconductor material such that said semiconductor material protrudes above a surface of the semiconductor layer or substrate, and implanting material in the semiconductor layer or substrate self-aligned with the semiconductor material protruding above a surface of the semiconductor layer or substrate.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
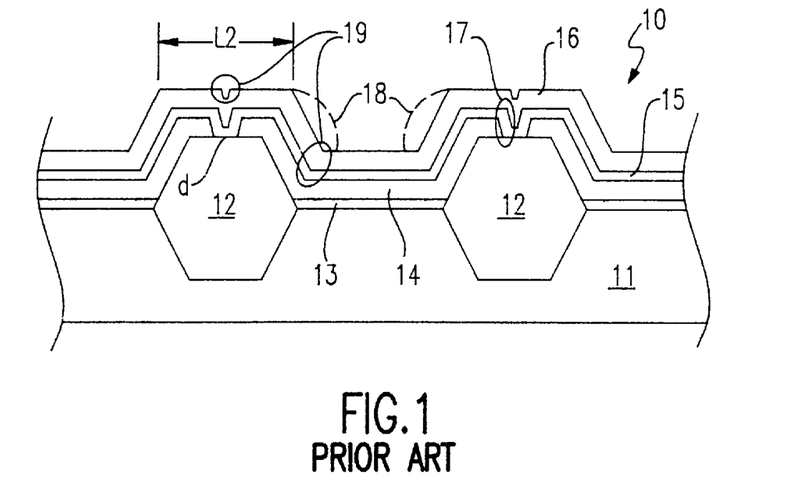
FIG. 1 is a cross-sectional view of a prior EEPROM or NVRAM cell structure.
Figure 2:
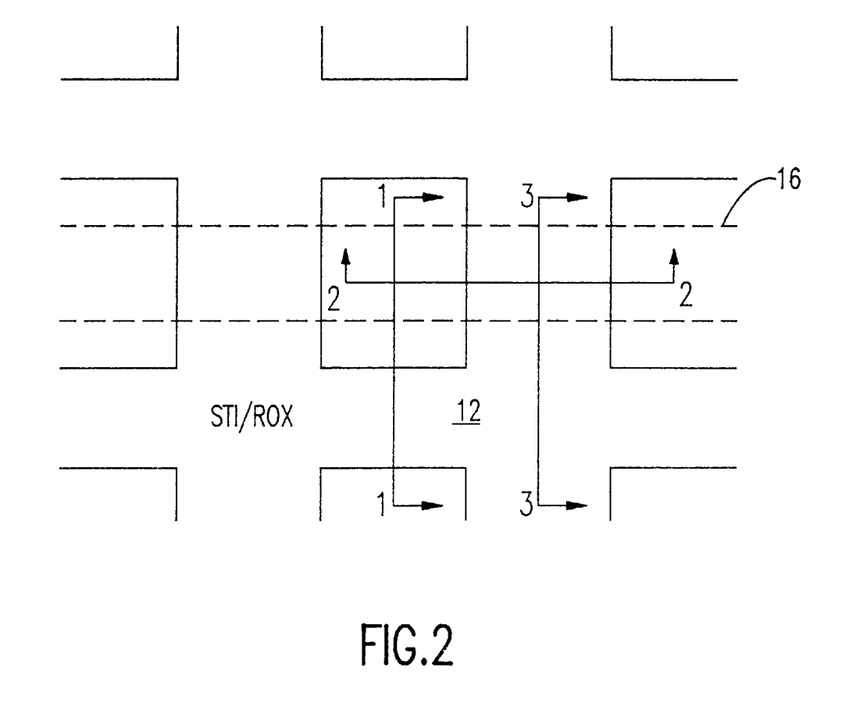
FIG. 2 is a plan view of EEPROM or NVRAM cell layout.

Referring now to the drawings, and more particularly to FIGS. 1 and 2, there is shown, in highly simplified cross-sectional form and plan view, respectively, an EEPROM or NVRAM gate structure 10 over which the present invention is an improvement. FIG. 2 is a plan view of the layout of the isolation structure 12 in the form of a grid and control gate 16 which is common to both the prior structure of FIG. 1 and the invention as will be described below. As to FIG. 2, however, the isolation structure is preferably a shallow trench isolation structure for practice of the invention rather than a recessed oxide structure shown in FIG. 1. However, a recessed oxide could also be employed in accordance with the principles of the invention.

In the structure 10 shown in FIG. 1, recessed oxide (ROX) 12 is used for isolation between adjacent gates. It is preferred that transistors including a floating gate for storage of charge be formed in very close proximity since the memory cells are programmed through series connections of the source and drain regions (in front of and behind the plane of the page of FIG. 1) and control gate electrode 16 of a plurality of such transistors. Close proximity of the NVRAM or EEPROM cells thus minimizes gate connector resistance as well as being generally necessary for high integration density. Therefore, isolation is generally necessary to minimize interaction between memory cells formed by those transistors in such close proximity.

In the EEPROM or NVRAM gate structure 10, a recessed oxide structure is formed and so called since a portion of the oxide 12 is recessed into the substrate 11. Regions between the ROX isolation structures are covered by a thin tunnelling oxide film 13. The floating gates 14 are preferably formed of doped polysilicon and extend not only over the tunnelling oxide but over the sloping sidewalls and a portion of the surface of the ROX isolation structures 12. The floating gates 14 are separated by a distance, d, at the upper surface of the ROX isolation structure 12 which governs the breakdown voltage.

The floating gates 14 and exposed portions of the ROX isolation structures are covered with a control gate oxide layer 15 and a second polysilicon layer which serves as the control gate electrode 16 and common connection. The area of the control gate oxide 15 between the control gate electrode 16 and the floating gate 14 establishes the capacitance therebetween. Therefore, it can be seen that the conventional structure imposes a trade-off between the capacitance value and the breakdown voltage for a given dimension L2 in a direction parallel to the substrate surface. Further, the severe surface topology of this structure tends to cause the control gate oxide (sometimes referred to as the inter-poly oxide) 15 to be of questionable quality in the encircled region 17 of the illustration of FIG. 1.

Poor quality oxide in this region reduces breakdown voltage and imposes a further requirement that ample spacing between floating gates be provided to obtain acceptable manufacturing yields. Moreover, the severe topography of the control gate 16 may cause breaks in regions 19 or support the unintended formation of sidewalls 18 by other processes. This circumstance will generally be aggravated if STI structures having vertical or more steeply sloped sides are employed even though such steeper sides may reduce dimension L2, as shown. It should also be noted that, due to the extent of floating gate 14, L2 must be wider than the separation of floating gates 14 and tends to reduce the area of the tunnelling oxide. Therefore L2 must be sized in accordance with both the ratio of oxide areas to obtain a desired capacitance ratio and also in regard to breakdown voltage and floating gate separation, adjusted for the possibility of poor quality oxide, in order to obtain satisfactory manufacturing yields.

The dimension L2 is thus a major portion of the "footprint" of an EEPROM cell which is not amenable to scaling to smaller sizes. This is particularly true since the very thin tunnelling oxide layer cannot be scaled in thickness consistent with reliability of formation; requiring certain minimum voltages to cause tunnelling and imposing limits on the minimum breakdown voltage which must be withstood by the device.

The invention simultaneously addresses the problems of breakdown, integration density and control gate connector topography notwithstanding employment of STI structures by forming NVRAM cells recessed within the substrate in the manner of a Damascene process and in a manner self-aligned with the isolation structures. Thus, process simplification is provided by the invention at maximum integration density while allowing maximum NVRAM cell area and coupling ratio and minimizing of the area of the isolation structure.

Figure 3:
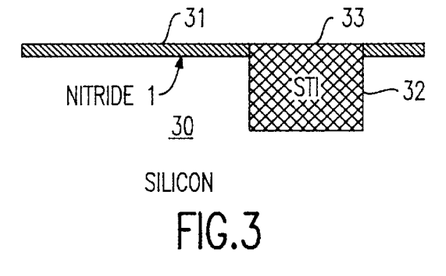
FIGS. 3, 4, 5, 6, 7, 8, 9, 10, 11, 12, 13, 14, 15, 16, 17 and 18 are cross-sectional views showing process steps in the practice of the invention and the formation of a damascene NVRAM cell in accordance therewith along section 1—1 of FIG. 2, orthogonal to a control gate conductor.
Figure 28:
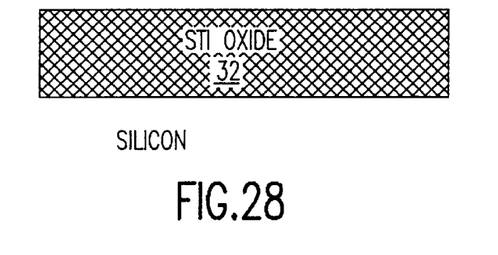

Referring now to FIG. 3–17, the process of forming a damascene NVRAM cell in accordance with the invention will be discussed. Specifically, in FIGS. 3 and 28, a substrate 30, preferably planarized by an oxide chemical/mechanical polishing process, is shown. A first nitride layer 31 is deposited thereon and patterned in accordance with desired locations 32 of shallow trench (or ROX) isolation structures. The STI trenches 32 are then filled and polished back to the nitride, forming the structure as shown in FIGS. 3 and 28 and having the general pattern illustrated in FIG. 2 in plan view. The nitride layer 31 has a high hardness and serves as a polish stop for polishing the STI fill.

Figure 4:
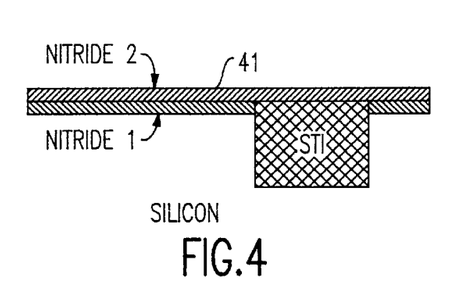
Figure 5:
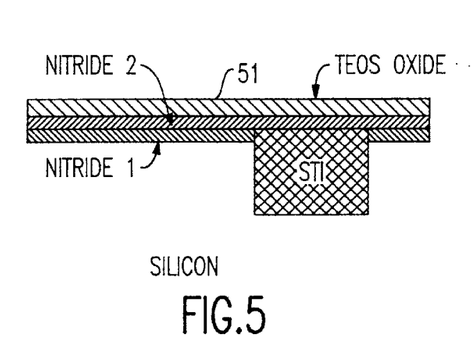
Figure 29:
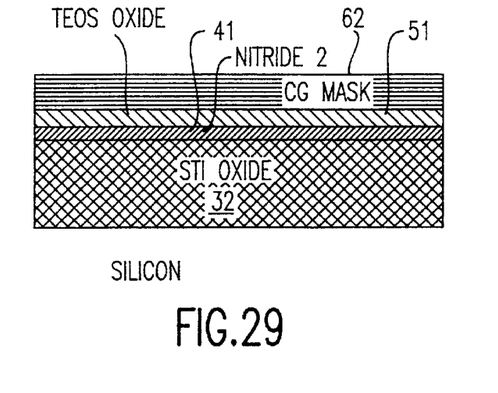

Then, as shown in FIGS. 4 and 29, a second nitride layer 41 is deposited. The process for depositing nitride layers 31 and 41 is not at all important to the invention and numerous suitable techniques are familiar to those skilled in the art. Then, as shown in FIGS. 5 and 29, an oxide layer 51 is deposited, preferably by a tetra-ethyl orthosilicate process familiar in the art but, again, not critical to the practice of the invention.

Figure 6:
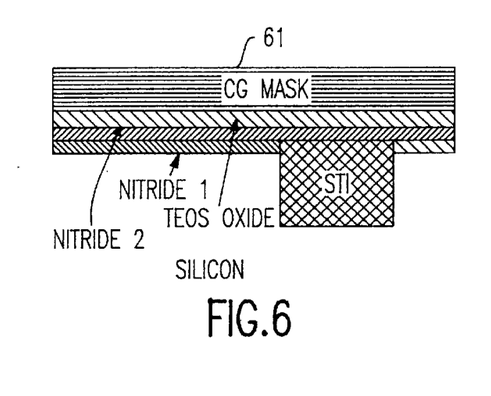
Figure 7:
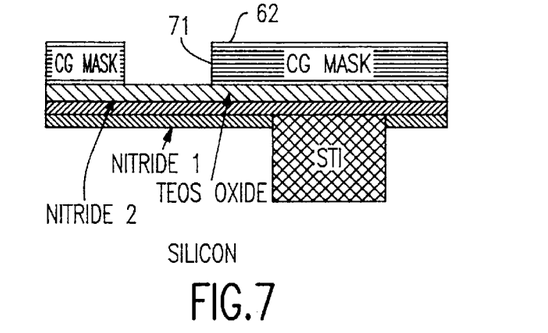

Next, a control gate mask layer 61 of a suitable resist is applied (FIG. 6) and patterned as indicated in FIG. 7. The regions over which the patterned resist does not lie correspond to the control gate connections (i.e. located as shown by dashed lines 16 in FIG. 2), and, between STI structures (in front of and behind the plane of the page of FIGS. 6 and 7), define locations of the NVRAM cells.

Figure 8:
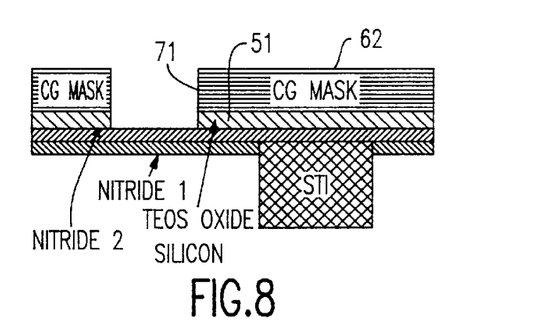
Figure 9:
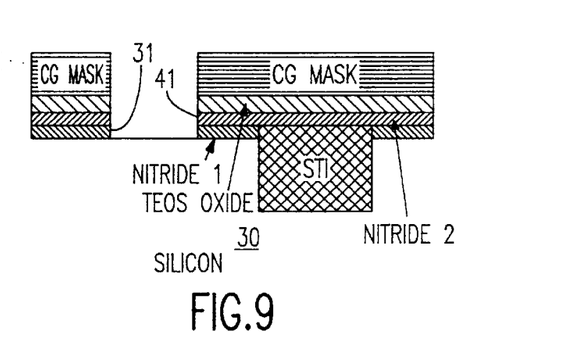
Figure 20:
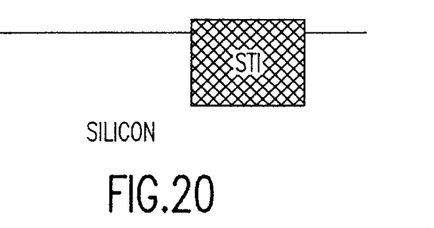
Figure 30:
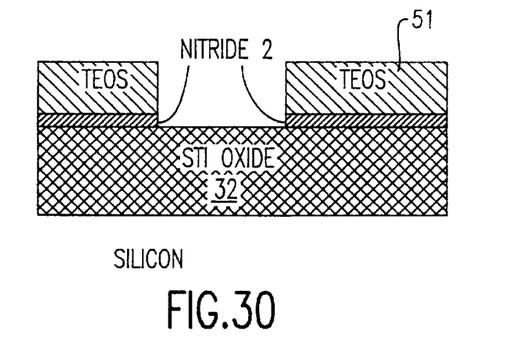

To form the NVRAM cells, the oxide layer 51 is selectively etched in accordance with the opening 71 in control gate mask 62, as shown in FIG. 8, followed by selectively etching of both first and second nitride layers 41, 31, as shown in FIG. 9, to expose the substrate. FIG. 20 corresponds to section 2—2 and FIG. 30 corresponds to section 3—3 at the same point in the process shown in FIG. 9 for section 1—1.

Figure 10:
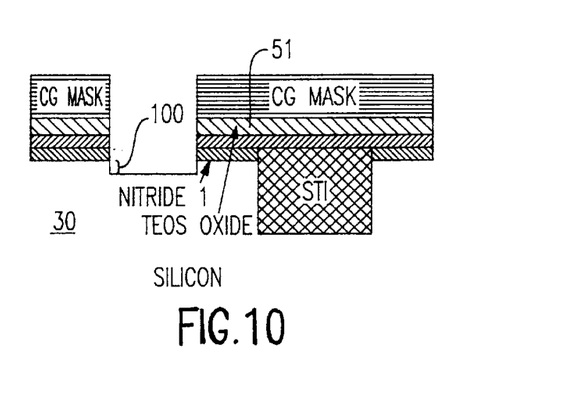
Figure 21:
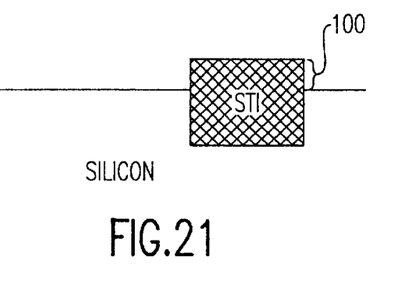

As shown in FIG. 10, along section 1—1, and 21, along section 2—2, the substrate is etched with an etchant which is selective to the substrate material (e.g. silicon) and which does not significantly etch the edge of oxide layer 51 (which is otherwise masked by resist mask 62) or the STI oxide 32.

Figure 11:
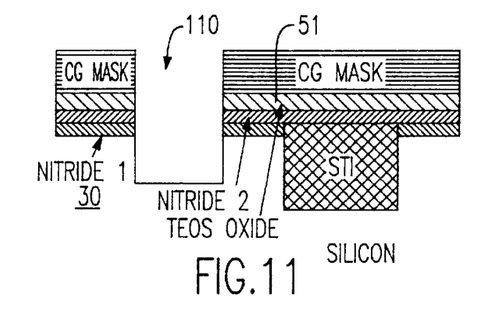
Figure 22:
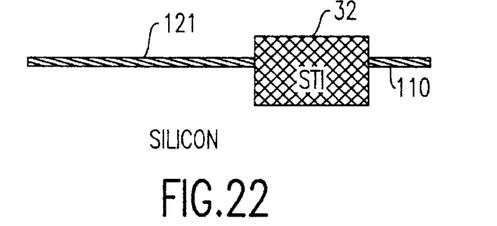
Figure 31:
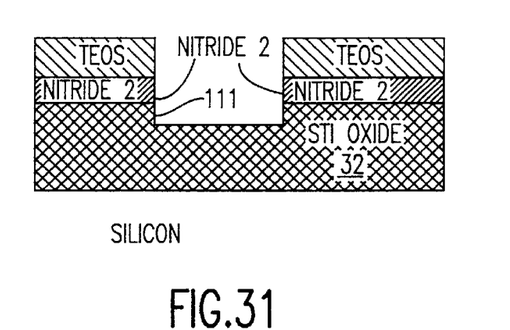

This etch is continued to form a recess 100 in the substrate preferably having a depth of about 80–150 nm. A subsequent etch of both the substrate 30 and the STI oxide 32 (which could be done in separate selective etch steps although a single non-selective etch is preferred) of an additional 200–500 nm is then performed as shown in FIG. 11 and 31. This reduces the STI oxide structure height along section 2—2, as shown in FIG. 22, appearing as a notch therein in FIG. 31. It should be noted that the surface of the silicon substrate as shown in FIG. 22 along section 2—2 corresponds to the bottom of the silicon trench 110 in FIG. 11.

Figure 12:
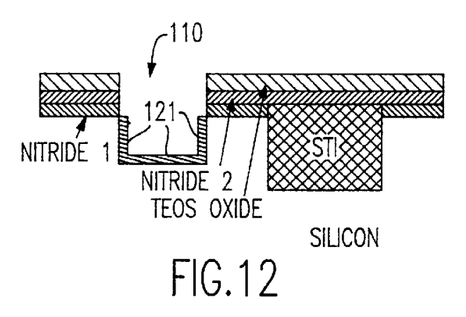
Figure 13:
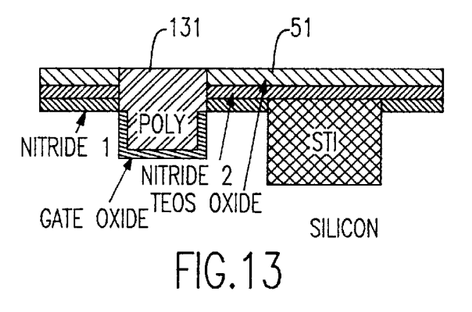
Figure 23:
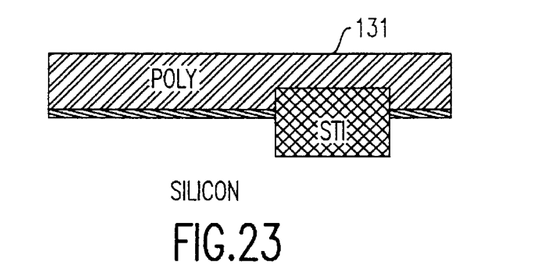

Once the damascene NVRAM cell trench 110 is thus completed, the control gate resist can be removed and, to remove any contamination from within the trench 110, an oxide is preferably grown and etched away. Then the tunnelling oxide 121 is grown within the trench to a desired thickness by any suitable process resulting in the structure shown in FIGS. 12 and 22. The preferred thickness is generally about 50 Angstroms but is not at all critical to the practice of the principles of the invention. As shown in FIG. 13 (and in an orthogonally taken cross-sectional view in FIG. 23), the damascene trench is filled by deposition of a layer of polysilicon which is polished back to the oxide 51 leaving a polysilicon strip 131 from which the floating gate will subsequently be formed.

It should be noted that the oxide 51 need not function as a polish stop since it will be later removed and the height of the polysilicon is not particularly critical to the final device since it will be etched back to much smaller dimensions within the trench although a particular height corresponding to the final thickness of oxide 51 may be exploited to advantage as will be discussed below. It should also be appreciated that the nitride layers 31, 41 and oxide layer 51 are in front of and behind the plane of the page in FIGS. 20–26 and therefore do not appear therein. Nitride layer 31 has been earlier etched away at the location of the STI structure (e.g. in the plane of section 3—3) in the course of formation thereof, as shown in FIG. 3 but the second nitride layer 41 appears in FIGS. 29–35 bounding the NVRAM cell trench 110 (located as shown by dashed lines 16 in FIG. 2 which also corresponds to the control gate electrode connection) while both nitride layers 31, 41, are seen in FIGS. 3–19 along section 2—2.

Figure 14:
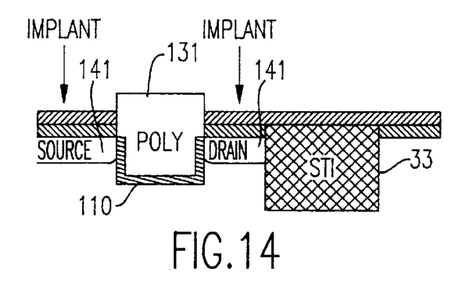
Figure 32:
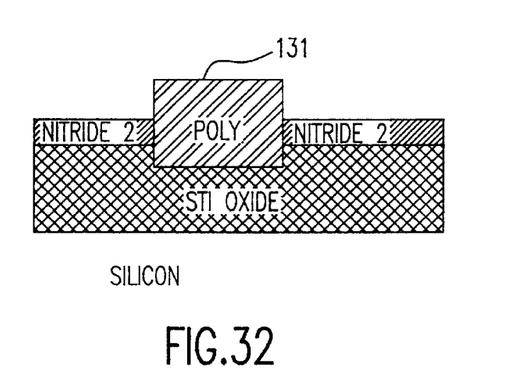

Referring now to FIGS. 14 and 32, the remainder of oxide layer 51 is selectively removed creating a polysilicon protrusion having a height above the surface of the nitride layer 41 equal to the thickness of the remaining oxide 51 of FIG. 13 after planarization by polishing. This protruding shape and height thereof is useful in limiting the depth within the polysilicon reached by the source/drain implant to be performed so that dopants/impurities which may be implanted in the polysilicon during the source/drain implant may be removed when the polysilicon 131 is etched to the dimensions of the floating gate as will be discussed below with reference to FIG. 15. Increased protection of the gate insulator 121 from implant damage is provided, as well, by the height of the protrusion. A timed etch is generally of sufficient accuracy although endpoint detection through optical emission spectroscopy or other techniques to more accurately form the floating gate could be based on the implant depth.

Source/drain implants are preferably then performed through the nitride layers 31, 41, and are thus effectively self-aligned with the polysilicon strip 131 and the STI structure 33. The implantation dose and energy should be adjusted in view of the dopant diffusion which will occur during a subsequent annealing process to place the source and drain junctions at approximately the bottom of trench 110. (FIG. 23 remains representative of the structure as it exists along section line 2—2 for the processes shown in FIGS. 12—14.) Alternatively, source and drain implantation and diffusion can be deferred until the point in the process shown in FIG. 18 after formation of a new polysilicon protrusion 171 with an oxide layer 181 thereover, as will be discussed below, and removal of nitride layers 31, 41.

Incidentally, the formation of a protrusion and related steps featured by the invention also has utility in the processing and structure of a recessed or damascene field effect transistor (FET) similar to the NVRAM cell but without provision of a floating gate (essentially the form shown in FIG. 14 before the floating gate is formed by etching back the polysilicon and deposition or growth of a control gate oxide). As is understood in the art, channel dopant concentrations and profiles are extremely important to the performance properties and threshold of field effect transistors as well as avoidance of latch-up, short channel effects (generally approached, in known field effect transistors formed on a semiconductor surface, by so-called lightly doped drain structures). However, optimal channel dopant concentrations are difficult to obtain in FETs formed at a substrate surface without affecting or being affected by the implant to form the source and drain regions. For example, raising the dopant concentrations under the source and drain regions increases the diffusion capacitance of the FET.

Figure 14A:
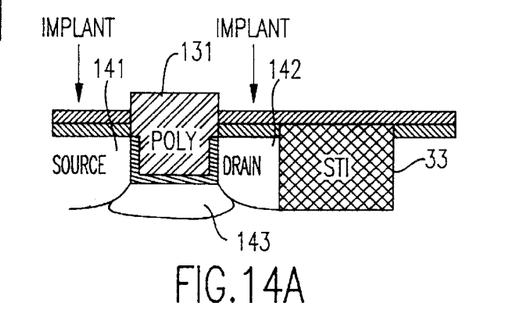
FIG. 14A is a cross-sectional view of a partially completed damascene field effect transistor which can be constructed employing the principles and processes of the invention.
Figure 18:
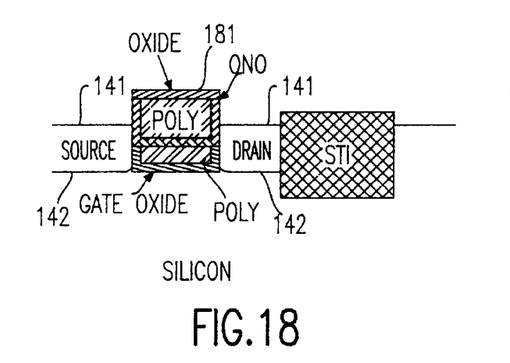
Figure 19:
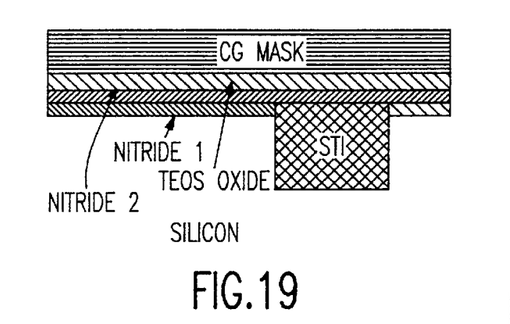
FIGS. 19, 20, 21, 22, 23, 24, 25, 26 and 27 are cross-sectional views of the device in accordance with the invention along section 2—2, parallel to a control gate conductor at various points in the manufacturing process depicted in FIGS. 3–18, and FIGS. 28, 29, 30, 31, 32, 33, 34, 35 and 36 are cross-sectional views of the device in accordance with the invention along section 3—3, of FIG. 2 orthogonal to the control gate conductor at various points in the manufacturing process depicted in FIGS. 3–18 and in the same direction but at the location of an isolation structure.

If a field effect transistor were to be formed by a damascene process, the channel would be recessed within a body of semiconductor material and impurities would be implanted at the bottom of the trench in which the gate would be formed as well as on either side of the trench/gate to form the source and drain regions as generally shown in FIG. 14A at 141, 142 and 143, respectively. Formation of these separate regions would generally require several distinct implantation steps with different dopants and, more importantly, at different energies. In this regard, it should be noted that in FIG. 11, the control gate mask 62 is present over nitride layers 31, 41, but that there is no layer formation on the interior of trench 110. In FIG. 12, the control gate mask has been removed and an oxide grown on the trench interior. In FIG. 13 the trench has been filled with polysilicon and the oxide layer 51 remains in place. In FIG. 14, the oxide 15 has been removed to leave a polysilicon protrusion 131 alluded to above while the nitride layers 31, 41, remain in place. In FIG. 18, the nitride layers have been removed while a protrusion has been formed to the thickness of the nitride layers. FIG. 18 also reflects diffusion of the source/drain implants.

Since impurity implant processes can be made through any of these layers mentioned in the preceding paragraph with suitable adjustment of the implant process energy and different layers are present in different combinations and thicknesses (which, with the exception of oxide 121, are all removed in the completed device) in the source/drain regions and in the channel/gate region, respectively, it can be seen that a variety of materials and thicknesses in different combinations are available and can be exploited as masks during implantation processes at various points in the process to tailor the implants.

Specifically, in the structure in accordance with the invention, the channel implant could be done at relatively low energy prior to formation of the polysilicon protrusion while the source and drain regions are masked by nitride, oxide and/or resist. After the protrusion is formed, the height of the protrusion allows higher energy source/drain implantation while effectively masking the channel. The variety and combinations of other layers in both material and thickness may permit implantation of the drain/source regions and the like concurrently with tailoring the channel profiles. The implantation of impurities in the polysilicon protrusion can also serve as a diffusion source for diffusion of the impurity into other surrounding structures.

It should also be appreciated that the ability to form high-performance transistors at high integration density by the same combination of processes by which the damascene NVRAM cells are formed also permits processing economies to be achieved in the development of decoders, drivers, logic and the like on the chip to support the function of the NVRAM array. It is only necessary to suitably segregate the processing of NVRAM cells and field effect transistors such that floating gates will not be formed and the gate oxide thickness optimized in the latter. Use of block-out masks at relatively low resolution during processes generally corresponding to FIGS. 15–17 is considered sufficient to segregate processing of field effect transistors and NVRAM cells.

Figure 15:
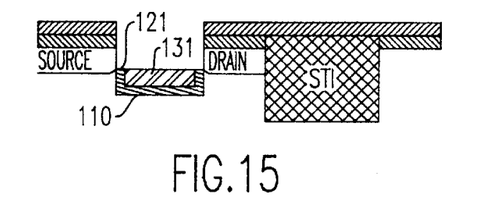
Figure 16:
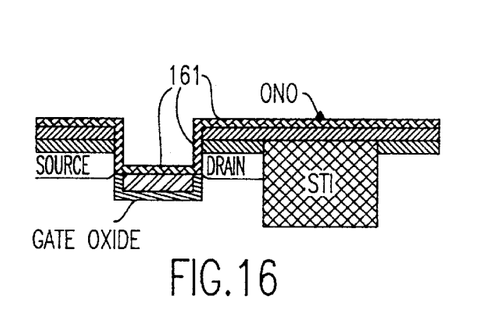
Figure 24:
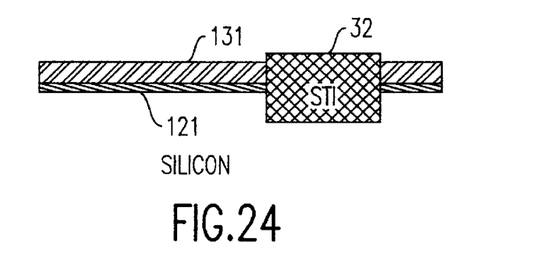
Figure 25:
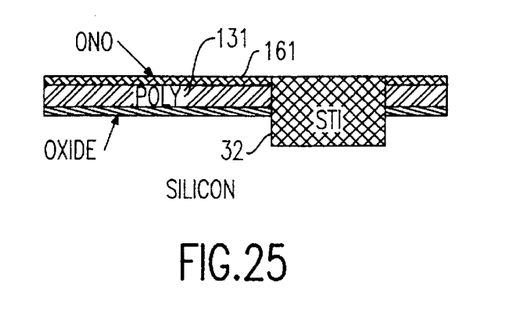
Figure 26:
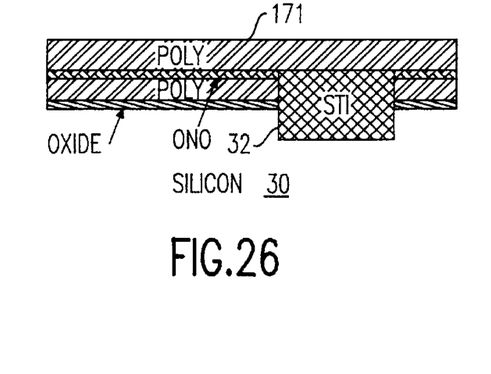
Figure 33:
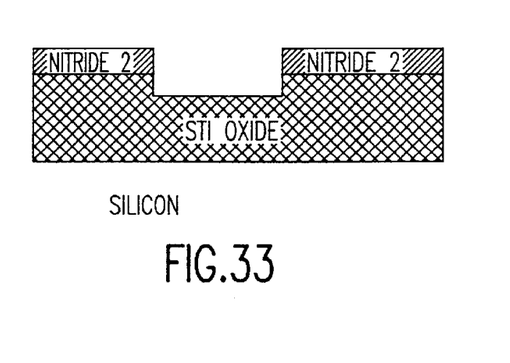
Figure 34:
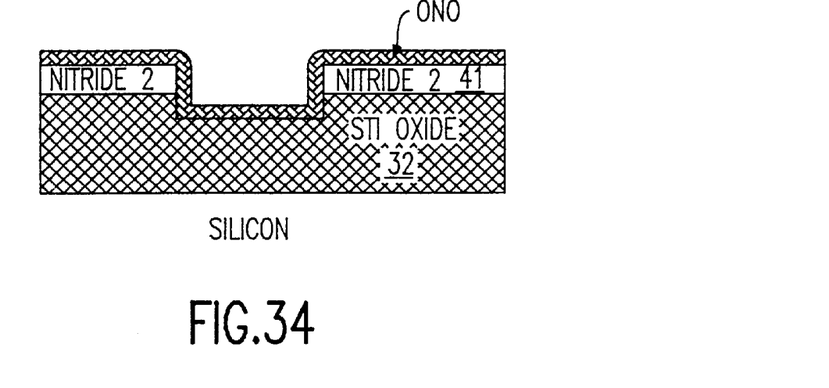

Returning to the NVRAM cell structure, once the source/drain implants are completed, the polysilicon 131 and tunnelling oxide 121 are etched back to a desired dimension as shown in FIGS. 15, 24 and 33. It should be noted from FIG. 24 that this etching process separates the floating gates 131 at the STI structures 32. Then a control gate dielectric layer 161, preferably of a layered oxide-nitride-oxide (ONO) construction, as shown in FIGS. 16, 25 and 34 is applied.

Figure 17:
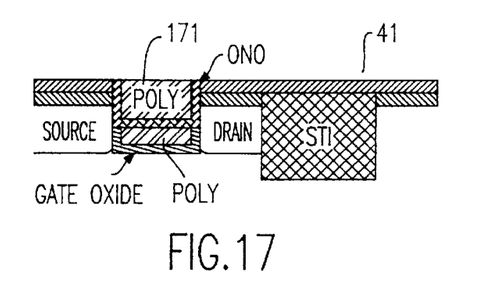
Figure 27:
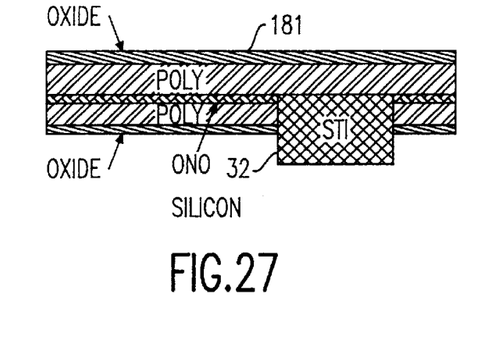
Figure 35:
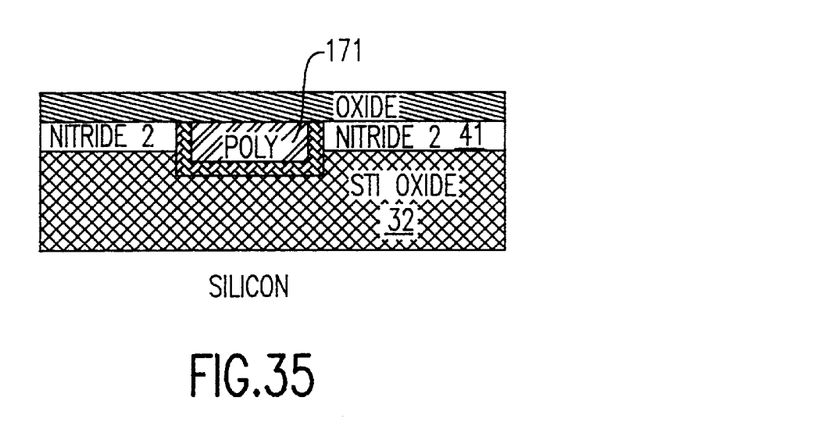
Figure 36:
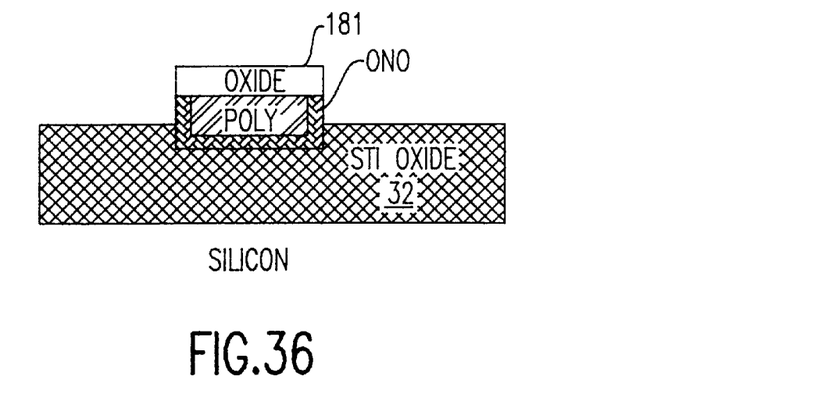

The remainder of the damascene trench opened by the etching of the floating gate 131 described above with reference to FIG. 15 is again filled with doped polysilicon by deposition of a blanket layer followed by polishing back to the nitride polish stop layer 41 as shown in FIG. 17 and 35. This process leaves further polysilicon strips 171 as control gates and their connections, extending over the STI structures 32 as may be best observed in FIGS. 26. The polysilicon control gate electrodes can then have a protective oxide 191 grown or deposited thereon, preferably during annealing to diffuse the source and drain regions to desired junction profiles 142, and the remaining portions of nitride layers 31, 41 can be stripped to complete the structure shown in FIGS. 18, 27 and 36.

The remainder of the device, including contacts to the structure of FIG. 18 as well as other logic, decoders, level shifters and the like or even macros or complete processors can be fabricated by known methods, preferably in accordance with the damascene FET process described above or CMOS technology, on the remainder of the chip. It should be appreciated that while areas on which other such circuits are to be formed could be covered by a block-out mask during the above-described operations, since many of the materials and processes described above are common to the formation of CMOS devices and circuits, many of the above-described processes are compatible therewith and can serve to concurrently form damascene FET or CMOS structures. Accordingly, some manufacturing economies and reduction of heat budget can potentially be achieved.

Corresponding application and removal of block-out masks at low resolution and wide tolerance of registration accuracy is a relatively low-cost and high yield process when processing specific to NVRAM cells or support circuitry must be carried out to the exclusion of the other. Note also that the NVRAM cell processes described above require only a single mask 62 to define the control gate electrode locations; after which all other processes are self-aligned or derive patterning by planarization in accordance with the damascene process described above and thus are of extremely high manufacturing yield.

In view of the foregoing, it is seen that the above described process provides a novel damascene NVRAM cell fabricated within a substrate or semiconductor layer which is self-aligned with isolation structures and utilizing the entire area therebetween to assure suitable coupling ratio of the control gate and floating gate thereof and adequate operating margins at relatively low write and erase voltages. The same features also allow minimization of NVRAM cell size and maximization of integration density to the limit of scalability and minimum width of control gate conductors that can be produced lithographically. Self-aligned processes also reduce process complexity while increasing process economy and manufacturing yield. Severe control gate connection topography is avoided and, since the self-aligned processes do not require allowance for alignment tolerances, maximum integration density may be realized.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of making a semiconductor device including the steps of:

forming a trench in a semiconductor substrate through an aperture in a layer of material formed on said semiconductor substrate, forming an insulator layer on a surface of said semiconductor substrate within said trench, filling said trench and said aperture with semiconductor material such that said semiconductor material protrudes above a surface of said semiconductor substrate, planarizing said semiconductor material, said trench filling and planarizing steps being performed in accordance with a damascene process, implanting material in said semiconductor substrate self-aligned with said semiconductor material protruding above a surface of said semiconductor substrate;

removing a portion of said semiconductor material in said trench;

depositing a further insulating layer in said trench over a remaining portion of said semiconductor material; and filling a remaining portion of said trench and said aperture with further semiconductor material.

2. A method as recited in claim 1, including the further step of implanting material into said semiconductor substrate prior to said step of filling said trench.

3. A method as recited in claim 1, including the further step of forming an isolation structure in a surface of said semiconductor substrate.

4. A method as recited in claim 1, including the further step of forming a nitride layer comprising said material on said surface of said semiconductor layer or substrate.

5. A method as recited in claim 4, including the further step of forming a further nitride layer comprising said layer of material on a surface of said nitride layer.

6. A method as recited in claim 5, including the further step of forming an oxide layer comprising said layer of material on said further nitride layer.

7. A method as recited in claim 1, including the further step of planarizing said semiconductor material to said layer of material.

8. A method as recited in claim 4, including the further step of planarizing an isolation structure to a surface of said nitride layer.

9. A method as recited in claim 6, including the further step of planarizing said semiconductor material to said oxide layer.

10. A method as recited in claim 5, including the further step of planarizing semiconductor material to said further nitride layer.

11. A method as recited in claim 1, wherein said trench is located between said implanted material.

12. A method as recited in claim 11, wherein said material filling said trench forms a gate structure of the transistor.

13. A method as recited in claim 1, wherein said implanting step includes a step of implanting said material in said semiconductor substrate through said layer of material formed on said semiconductor substrate.

14. A method as recited in claim 13, wherein said implanting step includes implanting said material in said substrate at a location adjacent to sidewalls of said trench.

15. A method as recited in claim 1, wherein said implanting step is performed after said filling step.

16. A method as recited in claim 1, wherein said insulating layer has respective ends which contact sidewalls of said trench, so as to isolate said semiconductor material within said insulating layer, the sidewalls of said trench, and a bottom of said trench.

17. A method as recited in claim 1, further comprising:

forming an isolation structure adjacent said trench, and wherein said implanting step includes implanting said material so as to be selfaligned with said isolation structure.

* * * * *